US012618620B2

(12) United States Patent
Schwarz et al.

(10) Patent No.: US 12,618,620 B2
(45) Date of Patent: May 5, 2026

(54) COMPONENT SYSTEM

(71) Applicant: ZKW Group GmbH, Wieselburg (AT)

(72) Inventors: Sebastian Schwarz, Pitten (AT); Holger Rottmann, Wiener Neustadt (AT); Dietmar Kieslinger, Theresienfeld (AT); Harald Graf, Würflach (AT)

(73) Assignee: ZKW Group GmbH, Wieselburg (AT)

( * ) Notice: Subject to any disclaimer, the term of this patent is extended or adjusted under 35 U.S.C. 154(b) by 100 days.

(21) Appl. No.: 18/644,665

(22) Filed: Apr. 24, 2024

(65) Prior Publication Data

US 2024/0361088 A1 Oct. 31, 2024

(30) Foreign Application Priority Data

Apr. 28, 2023 (EP) ...................................... 23170610

(51) Int. Cl.
*F28F 3/12* (2006.01)
*B05C 7/02* (2006.01)
(Continued)

(52) U.S. Cl.
CPC .................. *F28F 3/12* (2013.01); *F28F 3/04* (2013.01); *H05K 7/20454* (2013.01); *B05C 7/02* (2013.01);
(Continued)

(58) Field of Classification Search
CPC .......... F28F 3/12; F28F 3/04; H05K 7/20454; B05C 7/02; B05C 5/00; B05C 11/10;
(Continued)

(56) References Cited

U.S. PATENT DOCUMENTS 5,823,437 A * 10/1998 Bolyard, Jr. ............ B05C 5/027
239/391
6,222,264 B1 * 4/2001 O'Neal ................... H01L 23/42
257/714
(Continued)

FOREIGN PATENT DOCUMENTS

AT 516724 B1 * 8/2016 ........... H05K 3/0094
AT 517203 B1 * 12/2016 ............. H05K 1/111
(Continued)

OTHER PUBLICATIONS

Extended European Search Report for European Patent Application No. 23170610.2 dated Oct. 19, 2023 (6 Pages).

*Primary Examiner* — Ljiljana V. Ciric
(74) *Attorney, Agent, or Firm* — Eversheds Sutherland (US) LLP

(57) ABSTRACT

A component system including at least two components, between which a cavity to be filled is formed, wherein the cavity has a feed section, and a filling device for the filling of the cavity via a feed element, which can be introduced, before the filling procedure into the feed section. The feed element has a closure and sealing element, which is configured to close and seal the feed section in a closure position during the filling procedure. The closure and sealing element is configured as an elastically expandable body, which can change between the closure position and a release position. During an introduction of the feed element into the feed section, the closure and sealing element is in the release position, and can then be transferred into the closure position.

15 Claims, 6 Drawing Sheets

(51) Int. Cl.

| | |
|---|---|
| *B29C 39/10* | (2006.01) |
| *F28F 3/04* | (2006.01) |
| *H01L 23/367* | (2006.01) |
| *H01L 23/42* | (2006.01) |
| *H05K 7/20* | (2006.01) |

(52) U.S. Cl.
CPC .......... *B29C 39/10* (2013.01); *H01L 23/3672* (2013.01); *H01L 23/42* (2013.01)

(58) Field of Classification Search
CPC ..... B29C 39/10; H01L 23/3672; H01L 23/42; B05D 1/26
See application file for complete search history.

(56) References Cited

U.S. PATENT DOCUMENTS

| | | | | |
|---|---|---|---|---|
| 7,661,192 | B2 * | 2/2010 | Fujimori | G03B 21/145 |
| | | | | 29/890.038 |
| 9,925,698 | B2 * | 3/2018 | Van Dyck | B29C 31/044 |
| 10,438,868 | B2 * | 10/2019 | Liao | H01L 23/36 |
| 11,464,139 | B2 * | 10/2022 | Lofgreen | H05K 7/20254 |
| 12,048,122 | B2 * | 7/2024 | Leng | H05K 1/0203 |
| 2018/0109890 | A1 | 4/2018 | Pedersen | |
| 2023/0225087 | A1 | 7/2023 | Leng et al. | |
| 2024/0123867 | A1 * | 4/2024 | Al-Zareer | B60K 11/02 |
| 2024/0361088 | A1 * | 10/2024 | Schwarz | H05K 7/20454 |

FOREIGN PATENT DOCUMENTS

| | | | | | |
|---|---|---|---|---|---|
| AU | 2011238304 | A1 * | 7/2012 | | F28D 1/0015 |
| DE | 102013106192 | A1 * | 12/2014 | | B29C 39/10 |
| DE | 102014003049 | A1 * | 9/2015 | | B29C 44/1214 |
| EP | 3038436 | A1 | 6/2016 | | |
| EP | 2523894 | B1 * | 8/2017 | | B23K 3/0638 |
| EP | 3846600 | B1 * | 7/2024 | | H05K 1/181 |
| JP | 5026507 | B2 * | 9/2012 | | B23K 3/0638 |
| WO | WO-2011087961 | A1 * | 7/2011 | | B05C 5/0225 |

* cited by examiner

COMPONENT SYSTEM

CROSS-REFERENCE TO RELATED APPLICATIONS

This application claims priority to European Patent Application No. 23170610.2, filed Apr. 28, 2023, which is incorporated herein by reference.

Field of the Invention and Description of Prior Art

The invention relates to a component system, comprising:
at least two, in particular interconnected, components, between which a cavity that is to be filled is formed, wherein the cavity has a feed section, which opens out into a feed opening, which is formed on at least one of the at least two components, and
a filling device for the filling of the cavity in the course of a filling procedure, in which filling material, in particular a viscous liquid, can be filled into the cavity, wherein in the filled state, after the filling procedure, the filling material fills the cavity essentially completely, such that the at least two components are in contact with one another, at least in some sections, via the filling material, wherein the filling material is in particular a viscous heat-conducting material, and/or comprises a viscous adhesive,
wherein the filling device for the filling of the cavity with filling material has a feed element, which is designed so as to be introduced, before the filling procedure, through the feed opening into the feed section of the cavity, at least in some sections, along a direction of introduction, such that a pouring opening of the feed element projects into the feed section, wherein in the course of the filling procedure, filling material can be introduced, via the pouring opening, from the filling device through the feed section into the cavity, wherein the feed element has a closure and sealing element, which is designed so as, in the course of the filling procedure, to close and seal the feed section of the cavity in a closure position, such that the section of the feed element projecting into the feed section is secured within the feed section against being pushed out of the feed opening by a filling pressure that prevails in the course of the filling procedure, and that acts counter to the direction of introduction, and the feed opening is sealed, wherein the closure and sealing element is furthermore designed so as to enable, in a release position, the feed element to be introduced into, and removed, from the feed section via the feed opening, before and after the filling procedure.

The invention also relates to a method for the filling of a cavity.

In the prior art, there are component systems of known art that contain components and filling devices for the filling of cavities that are formed between the interconnected components. A cavity that is to be filled can, for example, be an air gap between a heat sink and a printed circuit board, wherein the air gap can usually be filled, or is designed to be filled, with a thermally conductive viscous filling material, for example a highly viscous thermally conducting paste, in order to improve the conduction of heat between the two components. A high injection pressure is required in order to introduce highly viscous liquids into narrow cavities, which in turn means that a feed element, for example an injection nozzle, which introduces the highly viscous liquid into the cavity, must be mechanically fixed to a feed opening of the cavity. This fixation must withstand a pressure that acts counter to the direction of fill. Mechanical fixations of known art (for example screw caps with seals) disadvantageously require a complex assembly of the feed element at the feed opening, and thus increase the time required for filling, and often require additional comprehensive mechanical closure means.

SUMMARY OF THE INVENTION

It is therefore an object of the present invention to alleviate or eliminate the disadvantages of the prior art. In particular, it is an object of the invention to create a component system in which a cavity between two components can be filled easily and reliably.

The object is achieved by a component system in accordance with claim 1 and, alternatively, by a component system in accordance with claim 11. The object is further achieved by a method in accordance with claim 15. Preferred forms of embodiment are described in the dependent claims.

In accordance with the invention, the closure and sealing element is configured as an elastically expandable body, which is designed so as to change between the closure position and the release position, wherein in the course of an introduction of the feed element into the feed section via the feed opening, the closure and sealing element is in the release position and, when the feed element has reached a filling position within the feed section, can be transferred into the closure position, wherein, in the closure position, an outer surface of the closure and sealing element bounding the closure and sealing element bears in a sealing manner against an edge surface of the feed section bounding the feed section, and movement of the feed element counter to the direction of introduction of the feed element is inhibited by the bearing action, wherein, after the filling procedure, the closure and sealing element can be transferred from the closure position to the release position, wherein, in the release position, the outer surface of the closure and sealing element is essentially free of any contact with the edge surface of the feed section, as a result of which, after the filling procedure, the closure and sealing element can be removed from the feed opening and the feed element can be removed from the feed section via the feed opening, counter to the direction of introduction.

This results in the advantage that the closure and sealing element (the closure position of which can also be referred to as a closure state; the release position of which can also be referred to as a release state) can be introduced, before the filling procedure into the feed opening, in the course of the filling procedure has a closure and sealing action on the feed opening (that is to say, on the feed section), and after the filling procedure can be removed from the feed opening, wherein, in particular, no additional fixation or sealing means are required. The (temporary) sealing of the feed opening and the inhibiting/fixation of the feed element counter to the direction of introduction can, in particular, be achieved by a sufficiently high adhesive contact between the outer surface (in the closed state, in particular, expanded to the maximum) of the closure and sealing element, and the edge surface of the feed section. In the release positions this adhesive contact can be released once again, as a result of which the closure and sealing element is spaced apart from the edge surface of the feed section. The closure and sealing element can be designed as a round body that can expand elastically in a radial direction.

It can be envisaged that the closure and sealing element is configured as an elastomeric body, which in the closure position has an essentially spherical shape, and in the release position has an essentially cylindrical shape. In particular, the elastomeric body can be designed as an expandable or inflatable ball.

It can be envisaged that the feed element has a feed channel with a longitudinal extent along the direction of introduction (in a state in which the feed element is arranged in the feed channel), through which the filling material can be passed, and at the distal end section of which the pouring opening is formed, wherein the feed channel has a wall bounding the feed channel, wherein the closure and sealing element is formed, in particular, on an elastic section of the wall.

It can be envisaged that the closure and sealing element is configured integrally with the feed element, in particular in the manner and shape of a balloon catheter, wherein the design in the manner and shape of a balloon catheter is preferably such that in the closure position it has an essentially spherical shape, and in the release position it has an essentially cylindrical shape.

It can be envisaged that in a main sectional plane that is orientated orthogonally to the direction of introduction, the feed opening has an opening shape that in the main sectional plane is configured in a manner corresponding to a cross-sectional shape of the feed element and the closure and sealing element in the release position. The opening shape and the cross-sectional shape are preferably designed to be circular in form.

It can be envisaged that the feed section is configured as an inlet channel with a longitudinal extent along the direction of introduction, wherein the feed section is configured to be a cylindrical shape or a rotationally conical shape along its longitudinal extent, with a rotationally conical radius that increases along the direction of introduction.

It can be envisaged that the filling material comprises a TIM—thermal interface material—that forms a thermal contact between the at least two components. The at least two components preferably comprise two components of a motor vehicle or a motor vehicle headlamp. The at least two components preferably comprise an element to be cooled, and a cooling element that can be attached to the latter, for example a lighting unit and a heat sink, or a printed circuit board and a heat sink.

It can be envisaged that the filling material is designed to harden, in particular after the filling procedure.

It can be envisaged that the closure and sealing element is configured as an expandable elastomeric cylindrical body, which has a first cylindrical radius in the release position, and a second cylindrical radius in the closure position, wherein the first cylindrical radius is smaller than the second cylindrical radius, wherein the feed section is configured as an inlet channel with a longitudinal extent along the direction of introduction, wherein the inlet channel is configured as a cylindrical shape along its longitudinal extent and has an inlet channel cylindrical radius that is essentially equal to or less than the second cylindrical radius of the closure and sealing element, such that in the closure position, in the course of the filling of the cavity, an outer surface of the expanded elastomeric cylindrical body makes contact with an inlet channel inner surface bounding the inlet channel in a sealing manner, and closing the feed opening, wherein the contact is such that a contact pressure is exerted by the expanded elastomeric cylindrical body on the inlet channel inner surface and the feed opening, that a contact pressure from the expanded outer surface acts radially on the inner surface of the inlet channel, wherein the contact pressure is such that any movement of the feed element counter to the direction of introduction of the feed element is inhibited, and the feed opening is sealed against any release of fluid. The (temporary) sealing of the feed opening, and the inhibiting/fixation of the feed element counter to the direction of introduction, can be achieved in particular by a sufficiently high adhesive contact or a frictional closure between the outer surface of the closure and sealing element (expanded, in particular to the maximum, in the closed state) and the inner surface of the inlet channel. In the release position, this adhesive contact can be released once again, as a result of which the closure and sealing element is spaced apart from the inner surface of the inlet channel. The expandable section of the elastomeric cylindrical body along the direction of introduction is preferably essentially the same length as the length of the inlet channel along the direction of introduction.

It can be envisaged that the elastomeric cylindrical body is formed in one piece with the feed element, wherein the pouring opening is arranged on a distal end section of the elastomeric cylindrical body.

It can be envisaged that the elastomeric cylindrical body has a filling channel, through which the filling material can be conveyed into the cavity in the course of the filling of the cavity, wherein the expandable section of the elastomeric cylindrical body encases the filling channel.

In accordance with an alternative solution, a component system is provided, comprising at least two, in particular interconnected, components, between which a cavity that is to be filled is formed, wherein the cavity has a feed section, which opens out into a feed opening that is formed on at least one of the at least two components, and a filling device for the filling of the cavity in the course of a filling procedure, in which filling material, in particular a viscous liquid, can be filled into the cavity, wherein in the filled state, after the filling procedure, the filling material fills the cavity essentially completely, such that the at least two components are in contact with one another at least in some sections via the filling material, wherein the filling material is in particular a viscous heat-conducting material and/or comprises a viscous adhesive, wherein the filling device for the filling of the cavity with filling material has a feed element, which is arranged to be introduced, before the filling procedure, through the feed opening into the feed section of the cavity, at least in some sections, along a direction of introduction, such that a pouring opening of the feed element projects into the feed section, wherein in the course of the filling procedure filling material from the filling device can be introduced, through the feed section into the cavity, via the pouring opening, wherein the feed element has a closure and sealing element, which is designed so as, in the course of the filling procedure, to close and seal the feed section of the cavity in a closure position, such that the section of the feed element projecting into the feed section is secured within the feed section against being pushed out of the feed opening by a filling pressure that prevails in the course of the filling procedure, and that acts counter to the direction of introduction, and the feed opening is sealed, wherein the closure and sealing element is furthermore designed so as to enable the feed element to be introduced into, and removed from, the feed section via the feed opening in a release position, before and after the filling procedure, wherein, in accordance with the invention, the closure and sealing element has a shape corresponding to the feed opening, so as with the feed section, for purposes of forming the closure position, to design a two-stage bayonet closure mechanism, wherein so as to form a first stage of the two-stage bayonet closure mechanism, the closure and sealing element can be introduced into the feed section via the feed opening, along the direction of introduction, and in the introduced state can be rotated about a first axis that is orientated parallel to the direction of introduction, wherein by a rotation of the closure and sealing element about the first axis through at least 45°, preferably through essentially 90°, a first contact of a first contact section of the closure and sealing element can be made with a first edge section of the feed section, bounding the feed section, wherein the first contact is such that any movement of the closure and sealing element counter to the direction of introduction is inhibited, wherein, so as to form the second stage of the two-stage bayonet closure mechanism, the closure and sealing element can be pivoted about a second axis that is orthogonal to the first axis, wherein the pivot point of the pivoting movement lies essentially at a centre point of the closure and sealing element, wherein, by the pivoting movement of the closure and sealing element about the second axis through at least 30°, preferably through essentially 45°, a second contact of a second contact section of the closure and sealing element can be made with a second edge section of the feed section, wherein the second contact is such that the feed opening is sealed by the closure and sealing element, in particular in the course of a filling of the cavity with filling material, and wherein, after the filling of the cavity, the second contact can be released by a reverse pivoting movement about the second axis, and the first contact can be released by a reverse pivoting movement about the first axis, so as to transfer the closure and sealing element into the release position.

It can be envisaged that the closure and sealing element is arranged on a distal end section of the feed element, which has the pouring opening.

It can be envisaged that the closure and sealing element is configured as a sphere that is flattened on two diametrically opposed spherical surface sections.

It can be envisaged that the feed element is designed as a feed channel, which has the closure and sealing element on a distal end section, wherein the closure and sealing element has a conduit section, which is connected to the feed channel in a fluid-conducting manner, such that filling material can flow from the feed channel into the conduit section of the closure and sealing element, wherein a distal end section of the conduit section has the pouring opening.

In accordance with the invention, a method for the filling of a cavity is provided, comprising the following steps:

Provision of a component system, with:

at least two, in particular interconnected, components, between which is formed a cavity that is to be filled, wherein the cavity has a feed section that opens out into a feed opening, which is formed on at least one of the at least two components, and a filling device for the filling of the cavity in the course of a filling procedure, in which filling material, in particular a viscous liquid, can be filled into the cavity, wherein in the filled state, after the filling procedure, the filling material fills the cavity essentially completely, such that the at least two components are in contact with one another, at least in some sections, via the filling material, wherein the filling material is, in particular, a viscous heat-conducting material, and/or comprises a viscous adhesive, wherein the filling device for the filling of the cavity with filling material has a feed element, which is designed so as to be introduced, before the filling procedure, through the feed opening into the feed section of the cavity, at least in some sections, along a direction of introduction such that a pouring opening of the feed element projects into the feed section, wherein in the course of the filling procedure, filling material can be introduced from the filling device, through the feed section into the cavity, via the pouring opening, wherein the feed element has a closure and sealing element which is designed so as, in the course of the filling procedure, to close and seal the feed section of the cavity in a closure position, such that the section of the feed element projecting into the feed section is secured within the feed section against being pushed out of the feed opening by a filling pressure that prevails in the course of the filling procedure, and that acts counter to the direction of introduction, and the feed opening is sealed, wherein the closure and sealing element is furthermore designed so as to enable the feed element to be introduced into, and removed from, the feed section via the feed opening in a release position, before and after the filling procedure, Introduction of the feed element into the feed section, Transference of the closure and sealing element to the closure position, in particular by the expansion of an expandable section of the closure and sealing element, such that the feed section of the cavity is closed and sealed, Filling of the cavity with filling material through the feed element, Transference of the closure and sealing element to the release position, in particular by the compression of the expanded section of the closure and sealing element, such that the feed element can be removed from the feed section, Removal of the feed element from the feed section.

BRIEF DESCRIPTION OF THE DRAWINGS

In what follows the invention is explained in more detail with reference to exemplary drawings. Here.

DETAILED DESCRIPTION OF EMBODIMENTS
OF THE INVENTION

Figure 1:
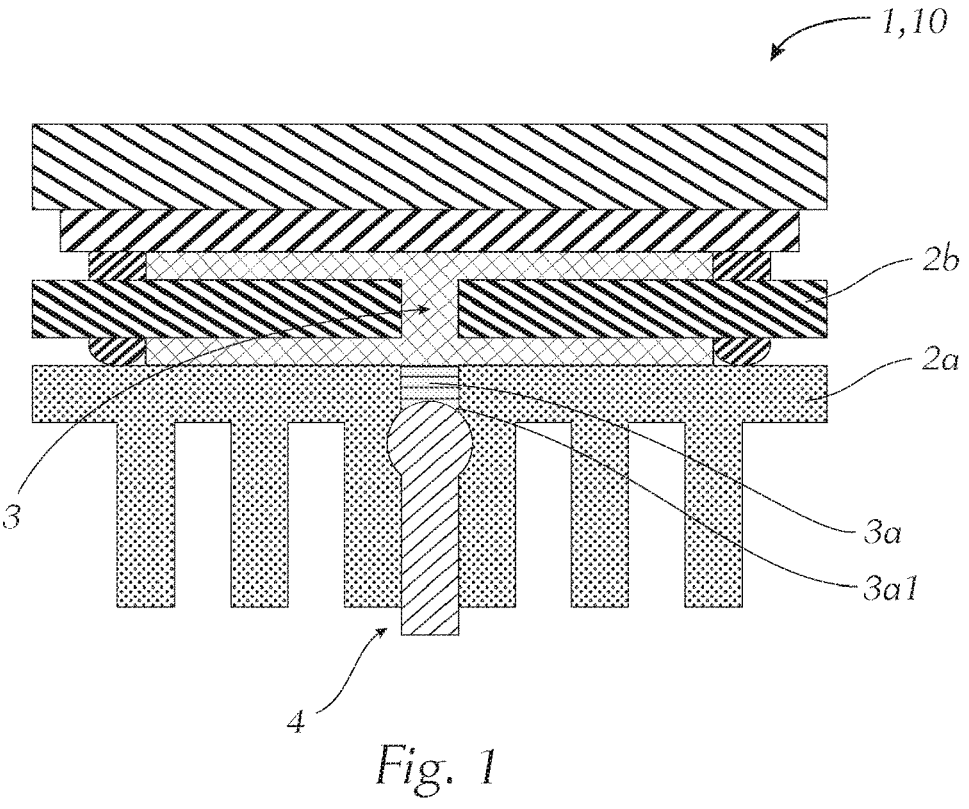
FIG. 1 shows a cross-sectional view of an inventive component system in accordance with a first example of embodiment.

FIG. 1 shows a cross-sectional view of a first example of embodiment of an inventive component system 1, comprising at least two components 2a, 2b, in particular interconnected, between which a cavity 3 that is to be filled is formed. The cavity 3 has a feed section 3a, which opens out into a feed opening 3a1, which is formed on the component 2a. The feed section 3a essentially leads into the cavity 3. The feed section 3a is configured as a cylindrical inlet channel with a longitudinal extent along a direction of introduction z.

Figure 2A:
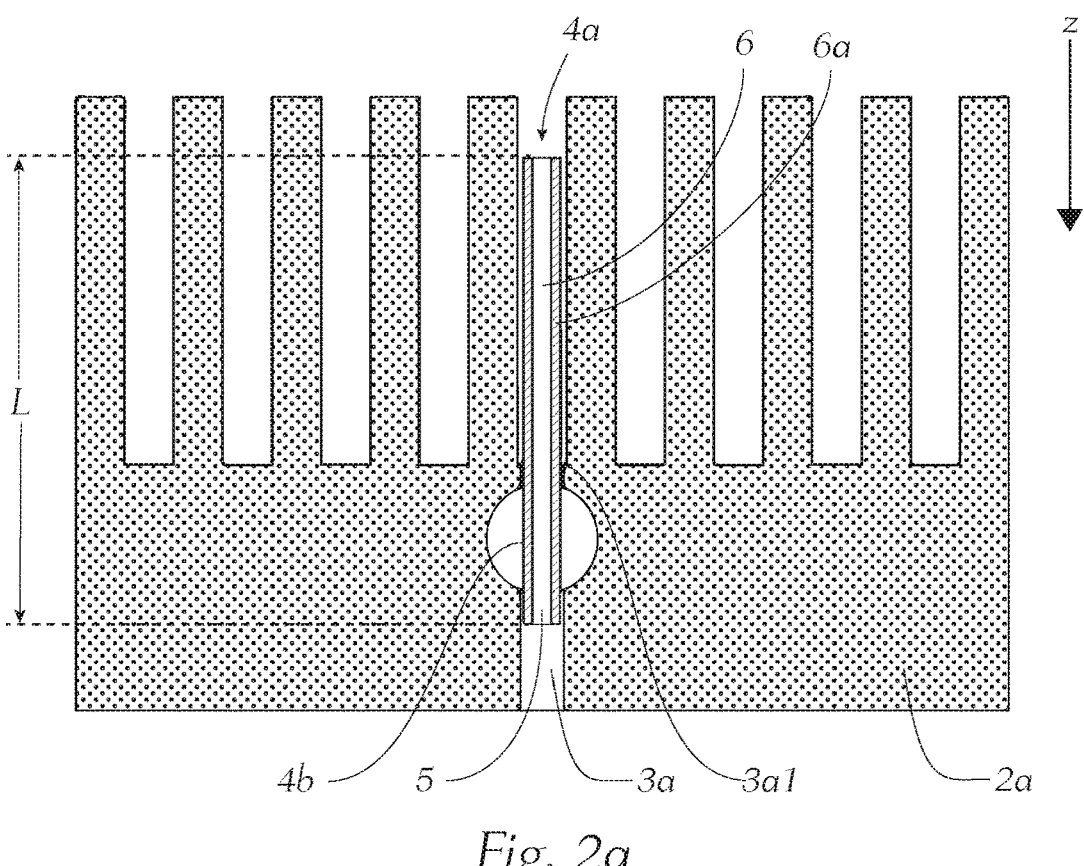
FIG. 2a shows a cross-sectional view of a component with a filling device in the release position.
Figure 2B:
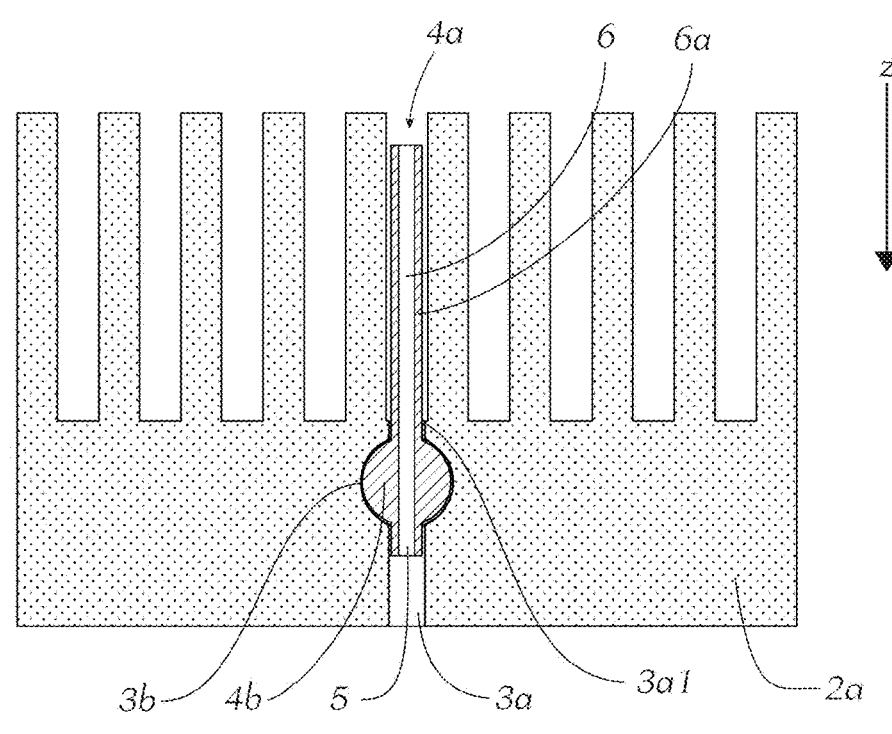
FIG. 2b shows a cross-sectional view of a component with a filling device in the closure position.

FIG. 2a and FIG. 2b show a detail of a first component 2a.

The component system 1 further comprises a filling device 4 for the filling of the cavity 3 in the course of a filling procedure, in which filling material, in particular a viscous liquid, can be, or is being, filled into the cavity 3. In FIG. 1 the filling device 4 is only shown schematically. In the filled state, after the filling procedure, the filling material fills the cavity 3 essentially completely, such that the at least two components 2a, 2b are in contact with each other, at least in some sections, via the filling material. In particular, the filling material can comprise a viscous thermally conductive material, and/or a viscous adhesive. The filling material can comprise a thermal interface material (TIM), which forms a thermal contact between the at least two components 2a, 2b. The filling material is preferably designed so as to harden after the filling procedure.

The filling device 4 has a feed element 4a for the filling of the cavity 3 with filling material, which feed element is designed so as to be introduced, before the filling procedure, at least in some sections, along the direction of introduction z, through the feed opening 3al into the feed section 3a of the cavity 3. In the introduced state, a pouring opening 5 of the feed element 4a projects into the feed section 3a. In the course of the filling procedure, filling material from the filling device 4 can be introduced into the cavity 3 through the feed section 3a, via the pouring opening 5. The feed element 4a comprises a feed channel 6, with a longitudinal extent L along the direction of introduction z, through which the filling material can be fed, and at the distal end section of which the pouring opening 5 is formed. The feed channel 6 has a wall 6a bounding the feed channel, wherein the closure and sealing element 4b is formed on a section of the wall 6a, in particular an elastic section.

In order to hold the feed element 4a in position in the course of the filling procedure, and to seal the feed opening 3al, the feed element 4a has a closure and sealing element 4b, which is designed to close and seal the feed section 3a of the cavity 3 in a closure position in the course of the filling procedure. The closure and sealing element 4b ensures that the section of the feed element 4a projecting into the feed section 3a is secured within the feed section 3a against being pushed out of the feed opening 3al by a filling pressure that acts counter to the direction of introduction z in the course of the filling procedure.

Furthermore, the closure and sealing element 4b is designed so as to seal the feed opening 3al in the course of the filling procedure. The closure and sealing element 4b is configured such that in a release position, before and after the filling procedure, it enables the feed element 4a to be introduced into, and removed from, the feed section 3a, via the feed opening 3al.

In the example of embodiment shown in FIG. 1, the closure and sealing element 4b can be configured as an elastically expandable (spherical) body (in detail: see FIGS. 2a to 2c), or as a ball-and-socket element with a bayonet action (in detail: see FIGS. 4 to 6), which is designed so as to transfer between the closure position and the release position. In what follows, the "elastically expandable body" form of embodiment is explained in more detail. The "bayonet form of embodiment" is explained in more detail further below, together with FIGS. 4 to 6.

In the course of an introduction of the feed element 4a into the feed section 3a via the feed opening 3a1, the closure and sealing element 4b is in the release position. This state is shown in FIG. 2a. In the example of embodiment shown in FIGS. 1 to 2c, the closure and sealing element 4b is configured as an elastomeric body, which in the closure position has an essentially spherical shape, and in the release position has an essentially cylindrical shape. The feed opening 3al preferably has an opening shape in a main sectional plane, which is orientated orthogonally to the direction of introduction z, which opening shape is configured in a manner corresponding to a cross-sectional shape, in the main sectional plane, of the feed element 4a and of the closure and sealing element 4b, in the release position.

When the feed element 4a has reached a filling position within the feed section 3a, the closure and sealing element 4b can be transferred into the closure position. In the closure position, the closure and sealing element 4b is expanded, and an outer surface of the closure and sealing element 4b bounding the closure and sealing element 4b is therefore in sealing contact with an edge surface 3b of the feed section 3a bounding the feed section 3a, and any movement of the feed element 4a counter to the direction of introduction of the feed element 4a is inhibited by the contact. This state is shown in FIG. 2b.

After the filling procedure, the closure and sealing element 4b can be transferred from the closure position to the release position. In the release position, the outer surface of the closure and sealing element 4b is essentially free of any contact with the edge surface 3b of the feed section 3a, as a result of which, after the filling procedure, the closure and sealing element 4b can be removed from the feed opening 3al, and the feed element 4a can also be removed from the feed section 3a via the feed opening 3a1, counter to the direction of introduction z.

Figure 2C:
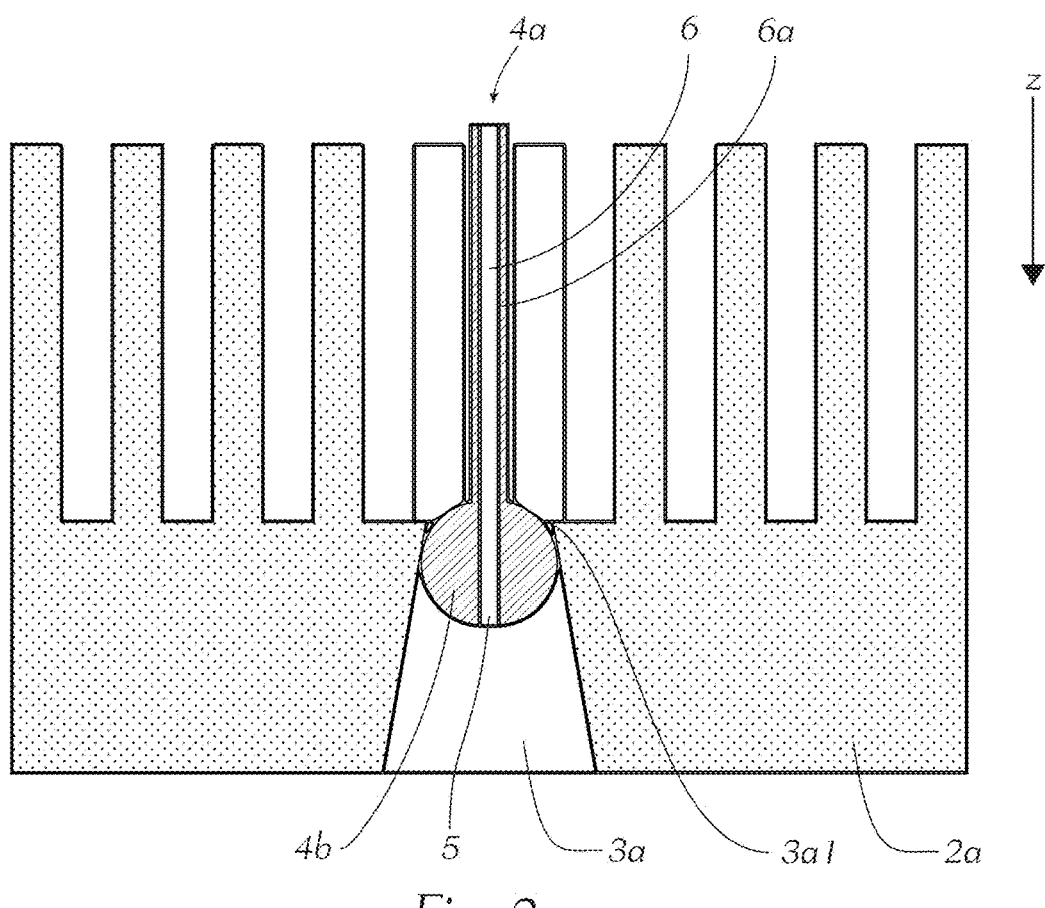
FIG. 2c shows a cross-sectional view of a component with a conical feed section.

In the example of embodiment in accordance with FIGS. 1 to 2c, the closure and sealing element 4b is configured integrally with the feed element 4a, in particular in the manner and shape of a balloon catheter, wherein the configuration in the manner and shape of a balloon catheter is preferably such that in the closure position it has an essentially spherical shape, and in the release position it has an essentially cylindrical shape.

In the example of embodiment shown in FIG. 2c, the feed section 3a is configured as a rotationally conical shape along its longitudinal extent, with a rotationally conical radius that increases along the direction of introduction z.

Figure 3A:
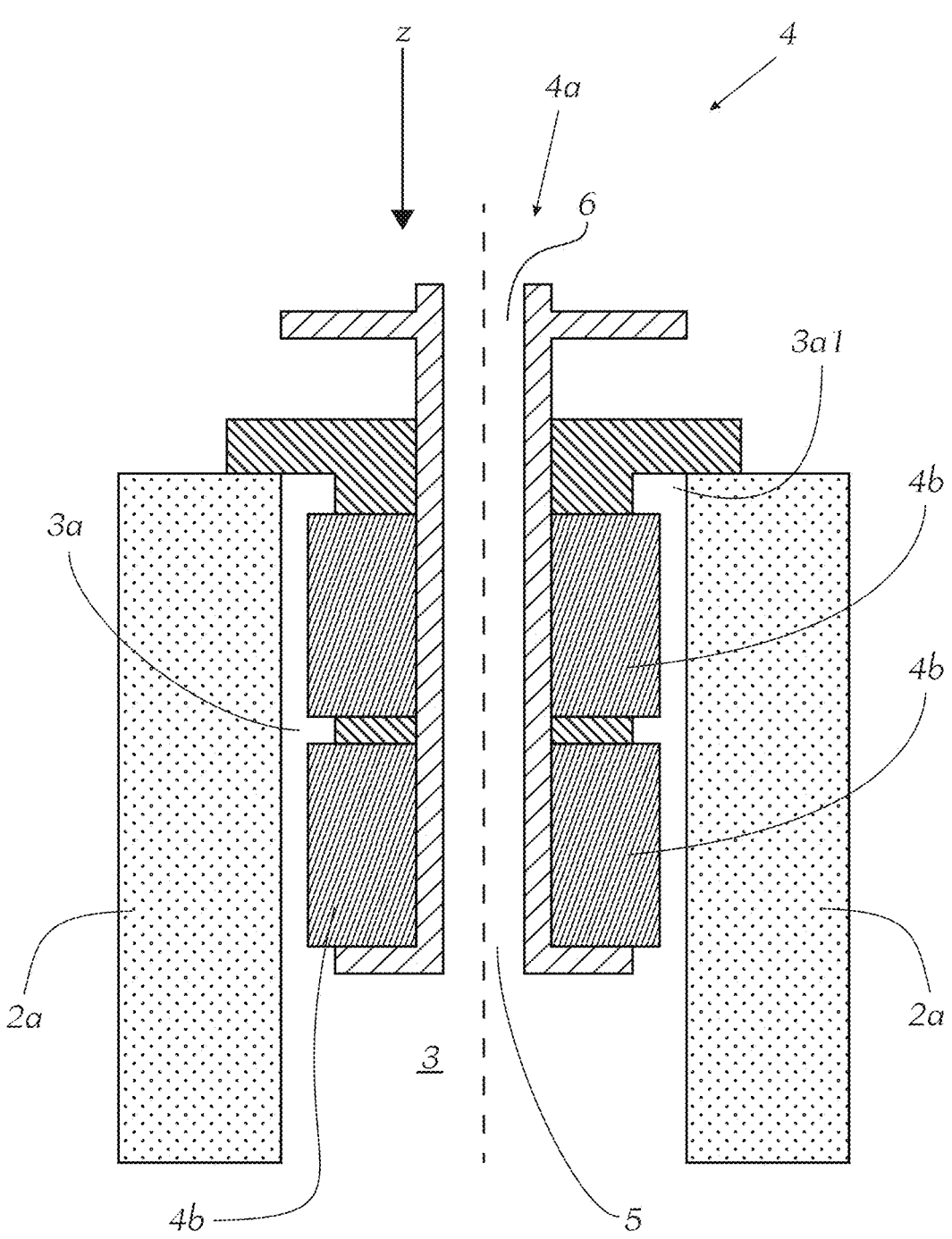
FIG. 3a shows a cross-sectional view of a component in accordance with a second example of embodiment, with a filling device in the release position.
Figure 3B:
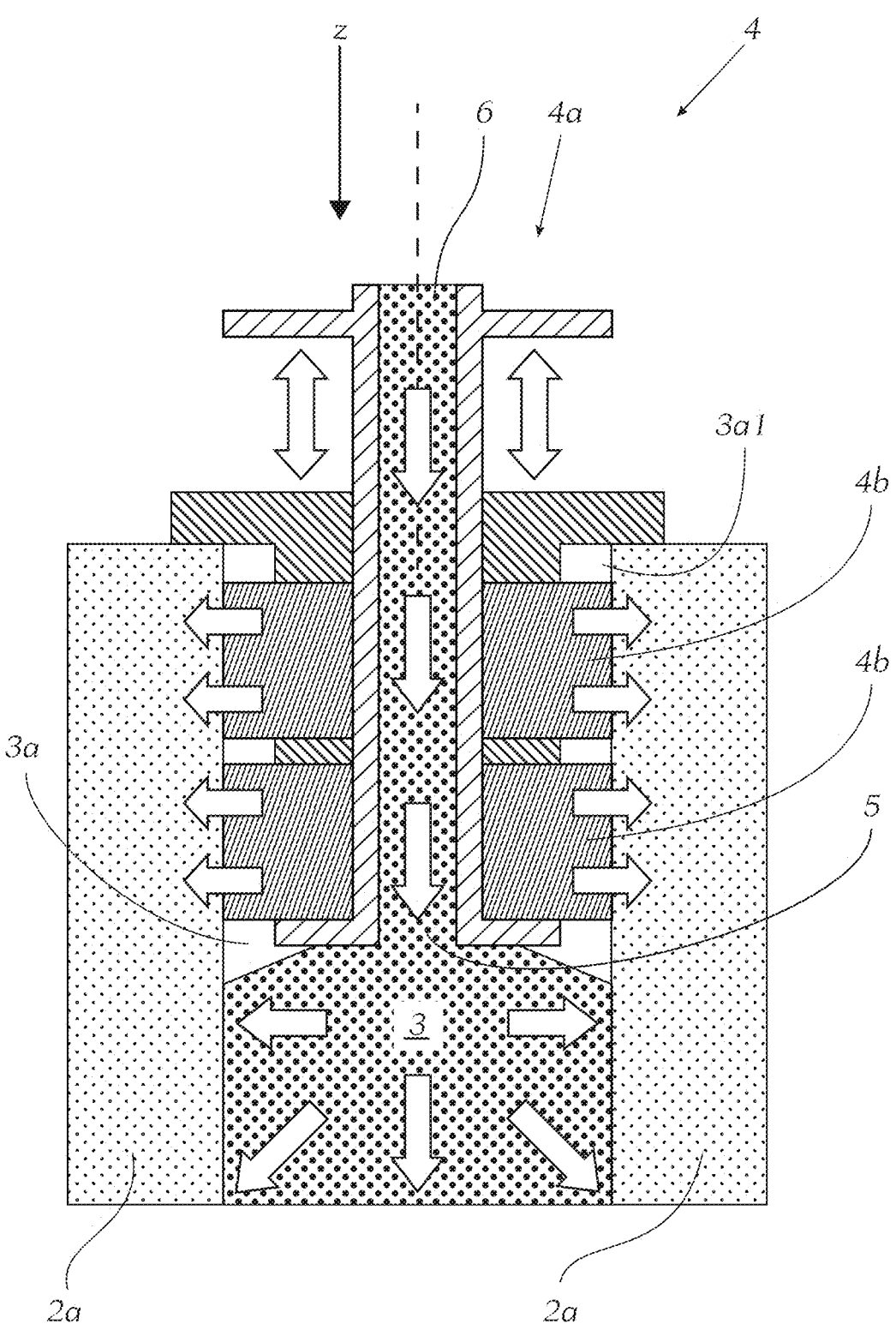
FIG. 3b shows the component shown in FIG. 3a with the filling device in the closure position.

FIGS. 3a and 3b show a second example of embodiment of a closure and sealing element 4b. In this example of embodiment, the closure and sealing element is configured as an expandable elastomeric cylindrical body. In the release position the elastomeric cylindrical body has a first cylindrical radius, and in the closure position it has a second cylindrical radius. The first cylindrical radius is less than the second cylindrical radius. The feed section 3*a* is configured
as an inlet channel with a longitudinal extent along the
direction of introduction z. The inlet channel is configured
along its longitudinal extent in a cylindrical shape, and has
a cylindrical radius that is essentially equal to or less than the
second cylindrical radius of the closure and sealing element
4*b*. Due to the variable (that is to say, enlargeable and
reducible) radius, a lateral surface of the expanded elasto-
meric cylindrical body in the closure position can, in the
course of the filling of the cavity 3, make sealing contact
with an inner surface of the inlet channel, bounding the inlet
channel, and thereby also closing the feed opening 3*a*1. This
contact is such that a contact pressure of the expanded outer
surface acts radially on the inner surface of the inlet channel,
as a result of which the contact pressure is such that any
movement of the feed element 4*a* counter to the direction of
introduction of the feed element 4*a* is inhibited, in particular
by an adhesive contact, and the feed opening 3*al* is sealed
against any release of fluid.

The elastomeric cylindrical body is preferably formed
integrally with the feed element 4*a*, as a result of which the
pouring opening 5 can be arranged on a distal end section of
the elastomeric cylindrical body. The elastomeric cylindrical
body has a filling channel, through which the filling material
can be conveyed into the cavity 3, in the course of the filling
of the cavity, wherein the expandable section of the elasto-
meric cylindrical body encases the filling channel.

Figure 4:
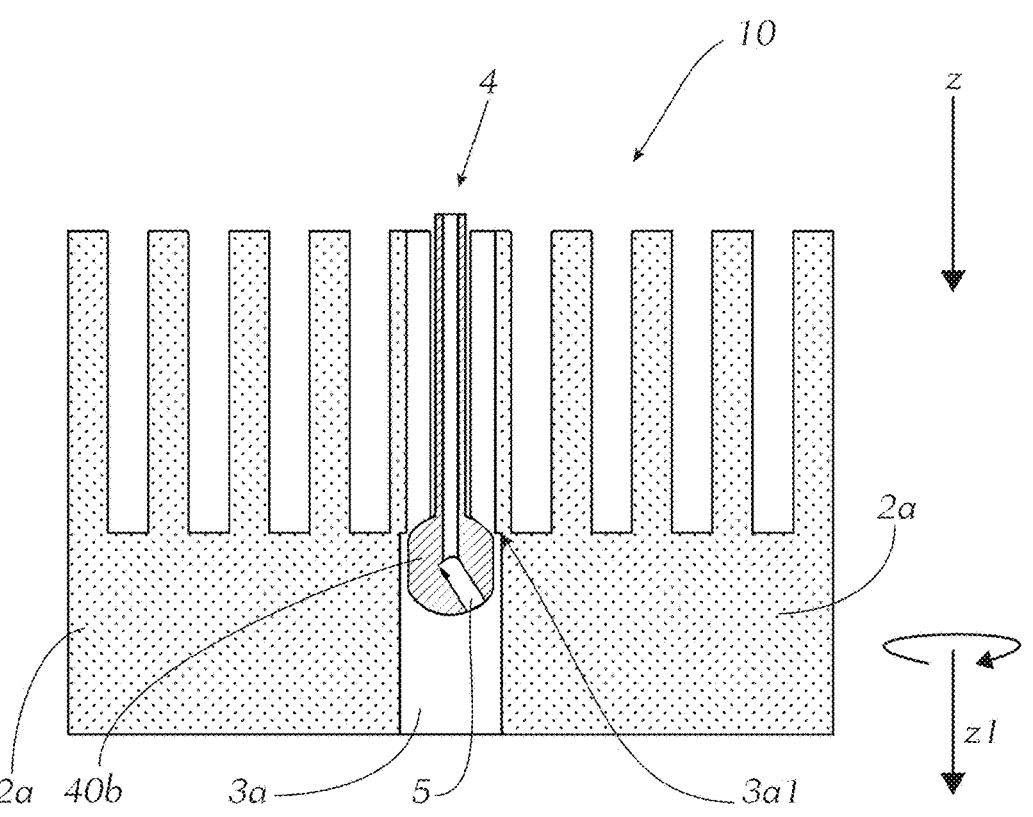
FIG. 4 shows a cross-sectional view of an inventive component system in accordance with a third example of embodiment, with a filling device in the release position.
Figure 5:
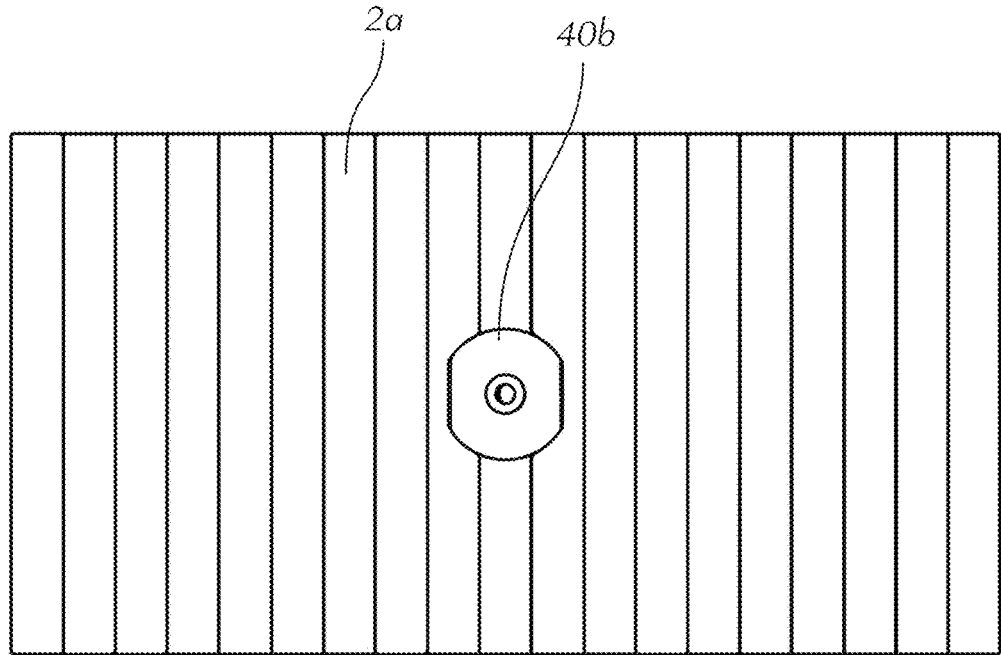
FIG. 5 shows a plan view onto the components of the component system shown in FIG. 4.
Figure 6:
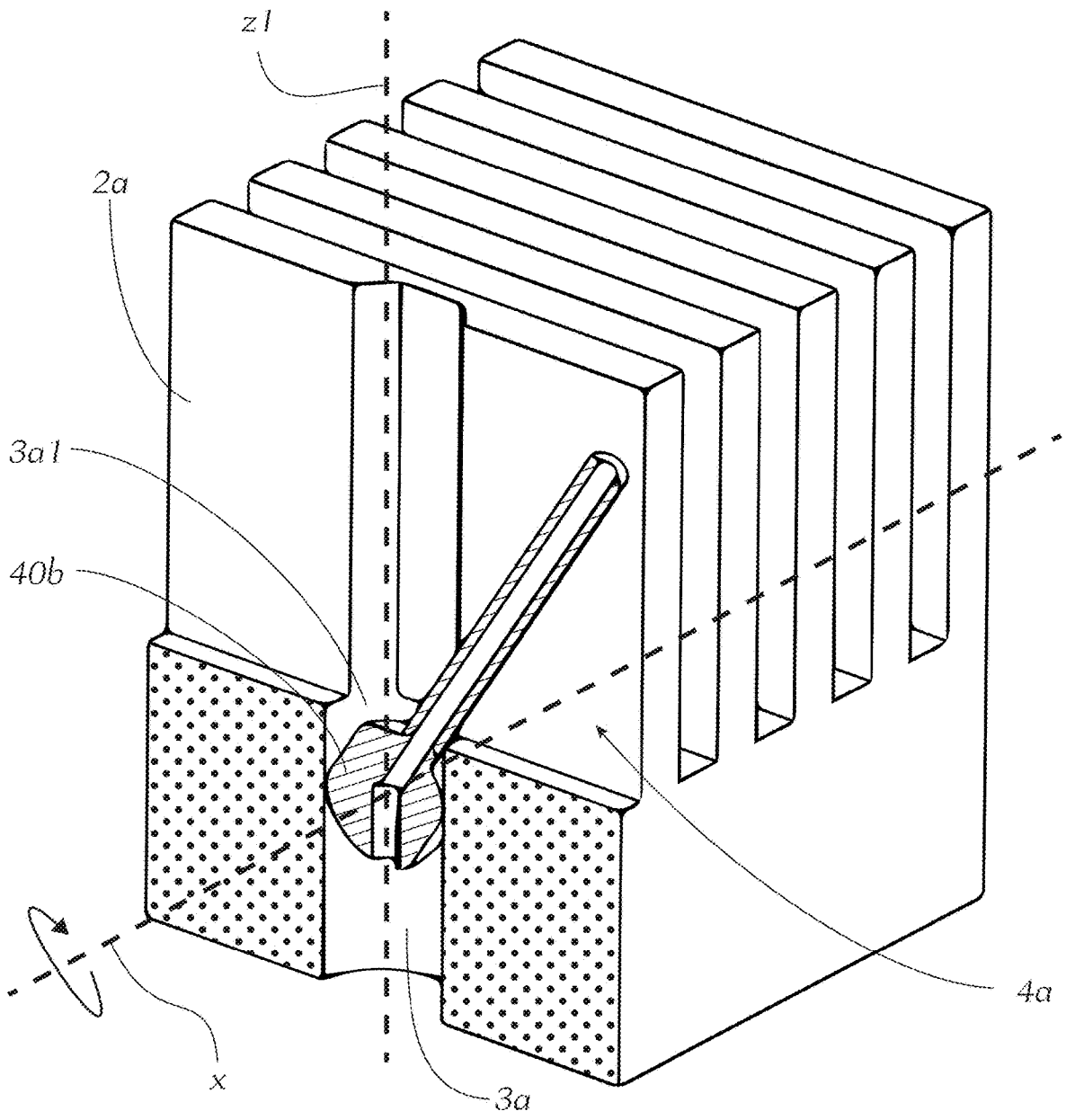
FIG. 6 shows a perspective view of the component system shown in FIG. 4, with the filling device in the closure position.

FIGS. 4 to 6 show a third example of embodiment of a
closure and sealing element 40*b*. Here too, the component
system comprises at least two, in particular interconnected,
components 2*a*, 2*b*, between which a cavity 3 that is to be
filled is formed. The cavity 3 has a feed section 3*a*, which
opens out into a feed opening 3*a*1, which is formed on the
component 2*a*.

The component system also comprises a filling device 4
for the filling of the cavity 3 in the course of a filling
procedure, in which filling material, in particular a viscous
liquid, can be filled into the cavity 3.

The filling device 4, for the filling of the cavity 3 with
filling material, has a feed element 4*a*, which is designed to
be introduced, before the filling procedure, through the feed
opening 3*al* into the feed section 3*a* of the cavity 3, at least
in some sections, along a direction of introduction z, such
that a pouring opening 5 of the feed element 4*a* projects into
the feed section 3*a*. In the course of the filling procedure,
filling material from the filling device 4 can be introduced
into the cavity 3 through the feed section 3*a* via the pouring
opening 5.

The feed element 4*a* has a closure and sealing element
40*b*, which is designed so as to close and seal the feed
section 3*a* of the cavity 3 in a closure position in the course
of the filling procedure, such that the section of the feed
element 4*a* projecting into the feed section 3*a* is secured
within the feed section 3*a* against being pushed out of the
feed opening 3*al* by a filling pressure that acts counter to the
direction of introduction z in the course of the filling
procedure. Furthermore, the feed opening 3*al* is sealed in the
closure position. The closure and sealing element 40*b* is also
designed so as to allow the feed element 4*a* to be introduced
into, and removed from, the feed section 3*a* via the feed
opening 3*al* in a release position, before and after the filling
procedure.

For this purpose, the closure and sealing element 40*b* has
a shape corresponding to the feed opening 3*a*, in order to
form with the feed section 3*a* a two-stage bayonet closure
mechanism, with which to form the closure position. In
order to form a first stage of the two-stage bayonet closure mechanism, the closure and sealing element 40*b* can be
introduced into the feed section 3*a* via the feed opening 3*al*
along the direction of introduction z, and, in the introduced
state, can be rotated about a first axis z1, which is orientated
parallel to the direction of introduction z. By this rotation of
the closure and sealing element 40*b* about the first axis z1
through at least 45°, preferably through essentially 90°, a
first contact section of the closure and sealing element 40*b*
can make a first contact with a first edge section of the feed
section 3*a*, bounding the feed section 3*a*. The first contact
inhibits any movement of the closure and sealing element
40*b* counter to the direction of introduction z.

In order to form the second stage of the two-stage bayonet
closure mechanism, the closure and sealing element 40*b* can
be pivoted about a second axis x, which is orthogonal to the
first axis z1. The pivot point of this pivoting movement lies
essentially at a centre point of the closure and sealing
element 40*b*. By pivoting the closure and sealing element
40*b* about the second axis x through at least 30°, preferably
through essentially 45°, a second contact section of the
closure and sealing element 40*b* can make a second contact
with a second edge section of the feed section 3*a*. As a result
of the second contact, the feed opening 3*al* is sealed by the
closure and sealing element 40*b*, in particular in the course
of the filling of the cavity 3 with filling material.

After the cavity has been filled, the second contact can be
released by a reverse pivoting movement about the second
axis x, and the first contact can be released by a reverse
pivoting movement about the first axis z1 so as to transfer
the closure and sealing element 40*b* into the release position.

As can be seen in FIG. 5, the closure and sealing element
40*b* is configured as a sphere that is flattened on two
diametrically opposed spherical surface sections. The feed
opening 3*al* has a complementary shape.

As can be seen in FIG. 6, the closure and sealing element
40*b* is arranged on a distal end section of the feed element
40*a*, which has the pouring opening 5.

The feed element 4*a* is designed as a feed channel, which
has the closure and sealing element 40*b* on a distal end
section. The closure and sealing element 40*b* has a conduit
section, which is connected to the feed channel in a fluid-
conducting manner, such that filling material can flow from
the feed channel into the conduit section of the closure and
sealing element 40*b*, wherein a distal end section of the
conduit section has the pouring opening 5.

LIST OF REFERENCE SYMBOLS

1, 10 Component system
**2*a*, 2*b*** Components
3 Cavity
**3*a*** Feed section
**3*a*1** Feed opening
**3*b*** Edge surface
4 Filling device
**4*a*** Feed element
**4*b*, 40*b*** Closure and scaling element
5 Pouring opening
6 Feed channel
**6*a*** Wall
L Longitudinal extent
X Second axis
z Direction of introduction
z1 First axis

The invention claimed is:

1. A component system (1) comprising:

at least two interconnected components (2a, 2b), between which a cavity (3) that is to be filled is formed, wherein the cavity (3) has a feed section (3a), which opens out into a feed opening (3a1), which is formed on at least one of the at least two components (2a, 2b); and a filling device (4) for the filling of the cavity (3) in the course of a filling procedure, in which a viscous liquid filling material can be filled into the cavity (3), wherein in the filled state, after the filling procedure, the filling material fills the cavity (3) essentially completely, such that the at least two components (2a, 2b) are in contact with one another, at least in some sections, via the filling material, wherein the filling material is a viscous heat-conducting material and/or comprises a viscous adhesive, wherein the filling device (4) for the filling of the cavity (3) with filling material has a feed element (4a), which is configured to be introduced, before the filling procedure, at least in some sections, along a direction of introduction (z) through the feed opening (3a1) into the feed section (3a) of the cavity (3), such that a pouring opening (5) of the feed element (4a) projects into the feed section (3a), wherein, in the course of the filling procedure, filling material from the filling device (4) can be introduced into the cavity (3) through the feed section (3a) via the pouring opening (5), wherein the feed element (4a) has a closure and sealing element (4b), which is designed so as to close and seal the feed section (3a) of the cavity (3) in a closure position in the course of the filling procedure, such that the section of the feed element (4a) projecting into the feed section (3a) within the feed section (3a) is secured against being pushed out of the feed opening (3a1) by a filling pressure that prevails in the course of the filling procedure, and that acts counter to the direction of introduction (z), and the feed opening (3a1) is sealed, wherein the closure and sealing element (4b) is furthermore designed so as to enable the feed element (4a) to be introduced into, and removed from, the feed section (3a) via the feed opening (3a1) in a release position, before and after the filling procedure, and wherein the closure and sealing element (4b) is configured as an elastically expandable body, which is designed to transfer between the closure position and the release position, wherein in the course of an introduction of the feed element (4a) into the feed section (3a) via the feed opening (3a1), the closure and sealing element (4b) is in the release position, and, when the feed element (4a) has reached a filling position within the feed section (3a), the closure and sealing element (4b) can be transferred into the closure position, wherein in the closure position, an outer surface of the closure and sealing element (4b) bounding the closure and sealing element (4b) can be transferred into the release position at an opening (3a1) which is adjacent to the feed section (3a), can be transferred to the closure position, wherein in the closure position an outer surface of the closure and sealing element (4b) bounding the closure and sealing element (4b) bears in a sealing manner against an edge surface (3b) of the feed section (3a) bounding the feed section (3a), and any movement of the feed element (4a) counter to the direction of introduction of the feed element (4a) is inhibited by the contact, wherein after the filling procedure the closure and sealing element (4b) can be transferred from the closure position to the release position, wherein in the release position the outer surface of the closure and sealing element (4b) is essentially free of any contact with the edge surface (3b) of the feed section (3a), as a result of which the closure and sealing element (4b) can be removed from the feed opening (3a1), and the feed element (4a) can be removed from the feed section (3a) via the feed opening (3a1), after the filling procedure, counter to the direction of introduction (z).

2. The component system (1) in accordance with claim 1, wherein the closure and sealing element (4b) is configured as an elastomeric body, which in the closure position has an essentially spherical shape, and in the release position has an essentially cylindrical shape.

3. The component system (1) in accordance with claim 1, wherein the feed element (4a) has a feed channel (6), with a longitudinal extent (L) along the direction of introduction (z), through which the filling material can be conducted, and on the distal end section of which the pouring opening (5) is formed, wherein the feed channel (6) has a wall (6a) bounding the feed channel, wherein the closure and sealing element (4b) is designed on an elastic section of the wall (6a).

4. The component system (1) in accordance with claim 1, wherein the closure and sealing element (4b) is configured integrally with the feed element (4a) in the manner or shape of a balloon catheter, wherein the configuration in the manner or shape of a balloon catheter is such that in the closure position it has an essentially spherical shape, and in the release position it has an essentially cylindrical shape.

5. The component system (1) in accordance with claim 1, wherein the feed opening (3a1) in a main sectional plane, which is orientated orthogonally to the direction of introduction (z), has an opening shape that is configured in a manner corresponding to a cross-sectional shape in the main sectional plane of the feed element (4a) and the closure and sealing element (4b) in the release position.

6. The component system (1) in accordance with claim 1, wherein the feed section (3a) is configured as an inlet channel with a longitudinal extent along the direction of introduction (z), wherein the feed section (3a) is configured to be cylindrical, or rotationally conical, with a rotational cone radius that increases along the direction of introduction (z), along its longitudinal extent.

7. The component system (1) in accordance with claim 1, wherein the filling material comprises a thermal interface material (TIM), which forms a thermal contact between the at least two components (2a, 2b).

8. The component system (1) in accordance with claim 1, wherein the closure and sealing element (4b) is configured as an expandable elastomeric cylindrical body, which has a first cylindrical radius in the release position, and a second cylindrical radius in the closure position, wherein the first cylindrical radius is less than the second cylindrical radius, wherein the feed section (3a) is configured as an inlet channel with a longitudinal extent along the direction of introduction (z), wherein the inlet channel is configured to be cylindrical along its longitudinal extent, and has an inlet channel cylindrical radius that is essentially equal to or less than the second cylindrical radius of the closure and sealing element (4b), such that in the closure position, in the course of the filling of the cavity (3), an outer surface of the expanded elastomeric cylindrical body makes contact with an inlet channel inner surface, bounding the inlet channel in a sealing manner, and closing the feed opening (3a1), wherein the contact is such that a contact pressure of the expanded outer surface acts radially on the inlet channel inner surface, wherein the contact pressure is such that any movement of the feed element (4*a*) counter to the direction of introduction of the feed element (4*a*) is inhibited, and the feed opening (3*a*1) is sealed against any release of fluid.

9. The component system (1) in accordance with claim 8, wherein the elastomeric cylindrical body is formed integrally with the feed element (4*a*), wherein the pouring opening (5) is arranged on a distal end section of the elastomeric cylindrical body.

10. The component system (1) in accordance with claim 8, wherein the elastomeric cylindrical body has a filling channel, through which the filling material can be conveyed into the cavity (3) in the course of the filling of the cavity, wherein the expandable section of the elastomeric cylindrical body encases the filling channel.

11. A component system (10), comprising:

at least two interconnected components (2*a*, 2*b*), between which a cavity (3) that is to be filled is formed, wherein the cavity (3) has a feed section (3*a*), which opens out into a feed opening (3*a*1), which is formed on at least one of the at least two components (2*a*, 2*b*); and a filling device (4) for the filling of the cavity (3) in the course of a filling procedure, in which a viscous liquid filling material can be filled into the cavity (3), wherein in the filled state, after the filling procedure, the filling material fills the cavity (3) essentially completely, such that the at least two components (2*a*, 2*b*) are in contact with one another, at least in some sections, via the filling material, wherein the filling material is a viscous heat-conducting material and/or comprises a viscous adhesive, wherein the filling device (4), for the filling of the cavity (3) with filling material, has a feed element (4*a*), which is designed so as to be introduced, before the filling procedure, through the feed opening (3*a*1) into the feed section (3*a*) of the cavity (3), at least in some sections, along a direction of introduction (z), such that a pouring opening (5) of the feed element (4*a*) projects into the feed section (3*a*), wherein in the course of the filling procedure, filling material from the filling device (4) can be introduced into the cavity (3) through the feed section (3*a*) via the pouring opening (5), wherein the feed element (4*a*) has a closure and sealing element (40*b*), which is designed so as to close and seal the feed section (3*a*) of the cavity (3) in a closure position in the course of the filling procedure, such that the section of the feed element (4*a*) projecting into the feed section (3*a*) within the feed section (3*a*) is secured against being pushed out of the feed opening (3*a*1) by a filling pressure that prevails in the course of the filling procedure, and that acts counter to the direction of introduction (z), and the feed opening (3*al*) is sealed, wherein the closure and sealing element (40*b*) is furthermore designed so as to enable the feed element (4*a*) to be introduced into, and removed from, the feed section (3*a*) via the feed opening (3*a*1) in a release position, before and after the filling procedure, wherein the closure and sealing element (40*b*) has a shape corresponding to the feed opening (3*a*), so as with the feed section (3*a*), for purposes of forming the closure position, to design a two-stage bayonet closure mechanism, wherein so as to form a first stage of the two-stage bayonet closure mechanism the closure and sealing element (40*b*) can be introduced into the feed section (3*a*) via the feed opening (3*a*1) along the direction of introduction (z) and, in the introduced state, can rotate about a first axis (z1), which is oriented parallel to the direction of introduction (z), wherein by means of a rotation of the closure and sealing element (40*b*) about the first axis (z1) through at least 45°, a first contact of a first contact section of the closure and sealing element (40*b*) can be made with a first edge section of the feed section (3*a*), bounding the feed section (3*a*), wherein the first contact is such that any movement of the closure and sealing element (40*b*) counter to the direction of introduction (z) is inhibited, wherein so as to form the second stage of the two-stage bayonet closure mechanism, the closure and sealing element (40*b*) is configured to be pivoted about a second axis (x), which is orthogonal to the first axis (z1), wherein the pivot point of the pivoting movement lies essentially at a centre point of the closure and sealing element (40*b*), wherein, by the pivoting movement of the closure and sealing element (40*b*) about the second axis (x) through at least 30° a second contact can be made by a second contact section of the closure and release element (40*b*) with a second edge section of the feed section (3*a*), wherein the second contact is such that the feed opening (3*a*1) is sealed by means of the closure and sealing element (40*b*), in the course of a filling of the cavity (3) with filling material, and wherein, after the filling of the cavity, the second contact is configured to be released by a reverse pivoting movement about the second axis (x), and the first contact is configured to be released by a reverse pivoting movement about the first axis (z1), so as to transfer the closure and sealing element (40*b*) into the release position.

12. The component system (10) in accordance with claim 11, wherein the closure and sealing element (40*b*) is arranged on a distal end section of the feed element (40*a*), which has the pouring opening (5).

13. The component system (10) in accordance with claim 11, wherein the closure and sealing element (40*b*) is configured as a sphere that is flattened on two diametrically opposed spherical surface sections.

14. The component system (10) in accordance with claim 11, wherein the feed element (4*a*) is designed as a feed channel, which has the closure and sealing element (40*b*) on a distal end section, wherein the closure and sealing element (40*b*) has a conduit section, which is connected to the feed channel in a fluid-conducting manner, such that filling material can flow from the feed channel into the conduit section of the closure and sealing element (40*b*), wherein a distal end section of the conduit section has the pouring opening (5).

15. A method for the filling of a cavity (3), the method comprising the following steps:

providing a component system (1, 10) in accordance with claim 1, with (A) at least two interconnected, components (2*a*, 2*b*), between which a cavity (3) that is to be filled is formed, wherein the cavity (3) has a feed section (3*a*), which opens out into a feed opening (3*a*1), which is formed on at least one of the at least two components (2*a*, 2*b*), and (B) a filling device (4) for the filling of the cavity (3) in the course of a filling procedure, in which a viscous liquid filling material can be filled into the cavity (3), wherein in the filled state, after the filling procedure, the filling material fills the cavity (3) essentially completely, such that the at least two components (2*a*, 2*b*) are in contact with one another, at least in some sections, via the filling material, wherein the filling material is a viscous heat-conducting material and/or comprises a viscous adhesive, wherein the filling device (4) for the filling of the cavity (3) with filling material has a feed element (4*a*), which is designed so as to be introduced, before the filling procedure, through the feed opening (3*a*1) into the feed section (3*a*) of the cavity (3), at least in some sections, along a direction of introduction (z), such that a pouring opening (5) of the feed element (4*a*) projects into the feed section (3*a*), wherein in the course of the filling procedure, filling material from the filling device (4) can be introduced into the cavity (3) through the feed section (3*a*) via the pouring opening (5), wherein the feed element (4*a*) has a closure and sealing element (4*b*, 40*b*), which is designed so as to close and seal the feed section (3*a*) of the cavity (3) in a closure position in the course of the filling procedure, such that the section of the feed element (4*a*) projecting into the feed section (3*a*) is secured within the feed section (3*a*)

against being pushed out of the feed opening (3*a*1) by a filling pressure that prevails in the course of the filling procedure, and that acts counter to the direction of introduction (z), and the feed opening (3*a*1) is sealed, wherein the closure and sealing element (4*b*, 40*b*) is furthermore designed so as to enable the feed element (4*a*) to be introduced into, and removed from, the feed section (3*a*) via the feed opening (3*a*1) in a release position, before and after the filling procedure;

introducing the feed element (4*a*) into the feed section (3*a*);

transferring the closure and sealing element (4*b*, 40*b*) into the closure position;

filling the cavity (3) with filling material through the feed element (4*a*);

transferring the closure and sealing element into the release position; and removing the feed element (4*a*) from the feed section (3*a*).

* * * * *